PRIOR ART  FIG. 1
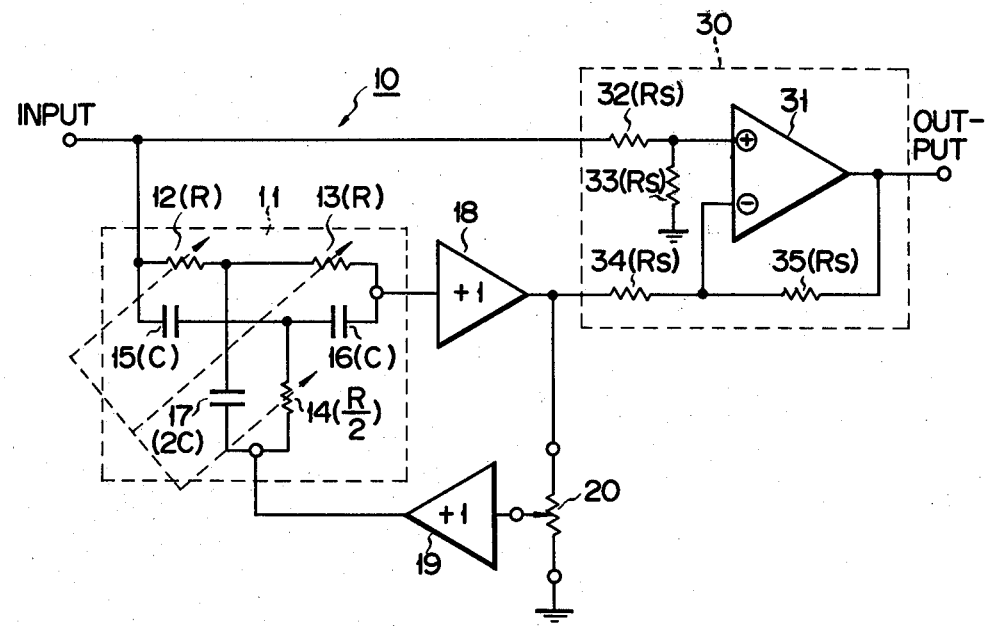
PRIOR ART  FIG. 2
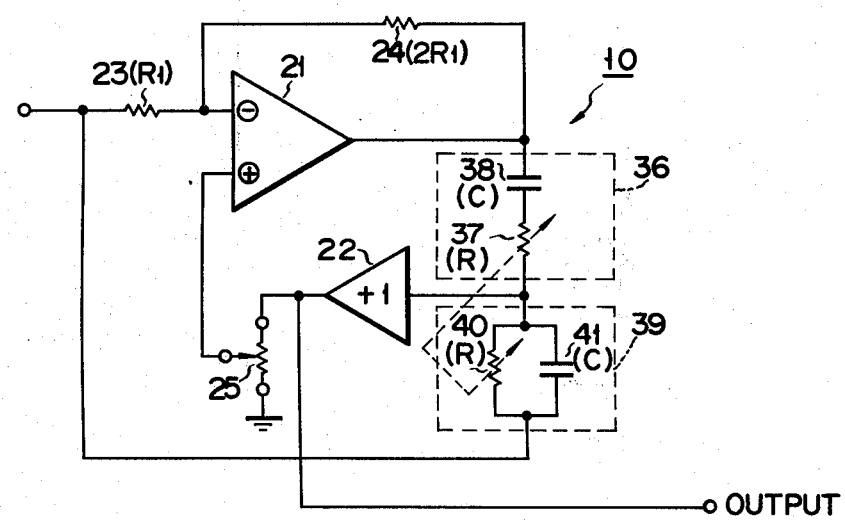

BANDPASS FILTER CIRCUIT

BACKGROUND OF THE INVENTION

The present invention relates to a filter circuit and, more particularly, to an active bandpass filter circuit capable of controlling independently the quality factor (Q) and center frequency of the filter circuit.

A graphic equalizer or a tone controller generally employed in audio systems includes a bandpass filter circuit for controlling the response of a speaker or listening room according to music being played. The filter circuit is usually arranged to independently adjust the center frequency and the quality factor thereof. It is preferable that such filter circuit can easily and independently adjust the center frequency and quality factor (Q value) thereof, receive music signals, whose dynamic range or allowable amplitude range is wide, without generating distortion, and have a simplified circuit configuration.

A prior art bandpass filter circuit shown in FIG. 1 comprises a band elimination filter circuit 10 and a subtraction circuit 30. The band elimination filter circuit 10 includes a twin-T network 11 having variable resistors 12–14 and capacitors 15–17 configured as shown in FIG. 1, first and second buffer amplifiers 18, 19 each having a gain of unity, and a potentiometer 20. The subtraction circuit 30, which serves to subtractively combine input and output signals of band elimination filter circuit 10 to provide bandpass characteristic, includes an operational amplifier 31 and resistors 32 to 35. Variable resistors 12, 13 and 14 are ganged with one another and adapted to adjust the center frequency of a pass band of filter circuit. The potentiometer 20 is adapted to adjust the quality factor (Q).

For the purpose of obtaining desired frequency responses by this prior art bandpass filter circuit, resistors 12 to 14 and capacitors 15 to 17 must be under a severe relation to have such values, respectively, as shown in FIG. 1. It is also very difficult to adjust values of variable resistors 12, 13 and 14 in an accurately associated manner to change the center frequency. Gang error is caused because of mismatching of variable resistors 12, 13 and 14, thereby deteriorating the bandpass characteristic. Gang error increases exponentially with the increased number of elements to be ganged.

FIG. 2 shows another prior art band elimination filter circuit 10 which may be used as the band elimination filter of the bandpass filter circuit shown in FIG. 1 which includes an operational amplifier 21, a buffer amplifier 22 having a gain of unity, resistors 23, 24, a potentiometer 25, a series circuit 36 of variable resistor 37 and capacitor 38, and a parallel circuit 39 of variable resistor 40 and capacitor 41. Variable resistors 37 and 40 are ganged with each other and adapted to adjust the center frequency of the bandpass filter. The potentiometer 25 is adapted to adjust the quality factor.

In the case of filter shown in FIG. 2, only two variable resistors may be ganged with each other to adjust the center frequency, so that gang error is reduced to some extent as compared with the circuit of FIG. 1. However, the circuit of FIG. 2 has such a drawback that the dynamic range of input signals is limited lower than half the maximum output voltage of amplifier 21 because the gain of operational amplifier 21 (two in this case) is determined by the ratio of resistors 23 and 24.

Both the bandpass filter circuit of FIG. 1 and the one in which the band elimination circuit of FIG. 2 is employed are complicated in circuit configuration to thereby increase cost.

SUMMARY OF THE INVENTION

An object of the present invention is to provide a filter circuit having a simple circuit configuration and capable of controlling the center frequency and quality factor easily and independently.

Another object of the present invention is to provide a filter circuit having a simple circuit configuration and capable of receiving input signals whose allowable amplitude range is comparatively wide.

A filter circuit embodying the present invention includes first and second resistors connected in series between input and output terminals of filter circuit, an amplifier having a gain of three having its output connected to the input terminal of the filter circuit, and an RC circuit network connected between the connection point of the first and second resistors and the input of the amplifier, said RC circuit network comprising a series combination of a third resistor and a capacitor connected between the connection point of first and second resistors and the input of the amplifier, and a parallel combination of a fourth resistor and a second capacitor connected between the input of the amplifier and a common terminal of the filter circuit.

The third and fourth resistors have a substantially equal resistance value and the first and second capacitors have a substantially equal capacitance value.

The ratio of resistance values of the first and second resistors may be changed to vary the quality factor of the filter circuit. One of the first and second resistors may therefore be of variable type.

Third and fourth resistors or first and second capacitors may be changed together to change the center frequency of the passband.

BRIEF DESCRIPTION OF THE DRAWINGS

FIG. 1 is a circuit diagram of a prior art bandpass filter circuit.

FIG. 2 shows another example of band elimination filter shown in FIG. 1.

DETAILED DESCRIPTION OF THE PREFERRED EMBODIMENT

Figure 3:
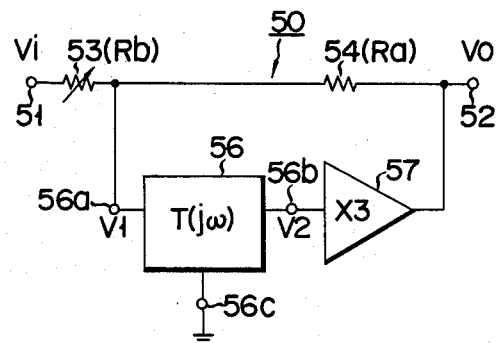
FIG. 3 is a schematic circuit diagram showing a filter circuit embodying the present invention.

As shown in FIG. 3, a bandpass filter 50 embodying the present invention includes a variable resistor 53 having a resistance value of Rb and a resistor 54 of a resistance value Ra, both resistors being connected in series between an input terminal 51 and an output terminal 52; a filter circuit 56 having its input terminal 56r inputs of operational amplifiers 71 and 76 and its center tap grounded; and the filter circuit 50 of this invention having the input terminal 51 connected to the output of operational amplifier 71, the output terminal 52 connected to a slider terminal 80c of the variable resistor, and the common terminal 56c grounded. Frequency responses shown in FIGS. 8 to 10 are obtained at an output terminal 79 of this frequency response adjusting circuit.

Figure 8:
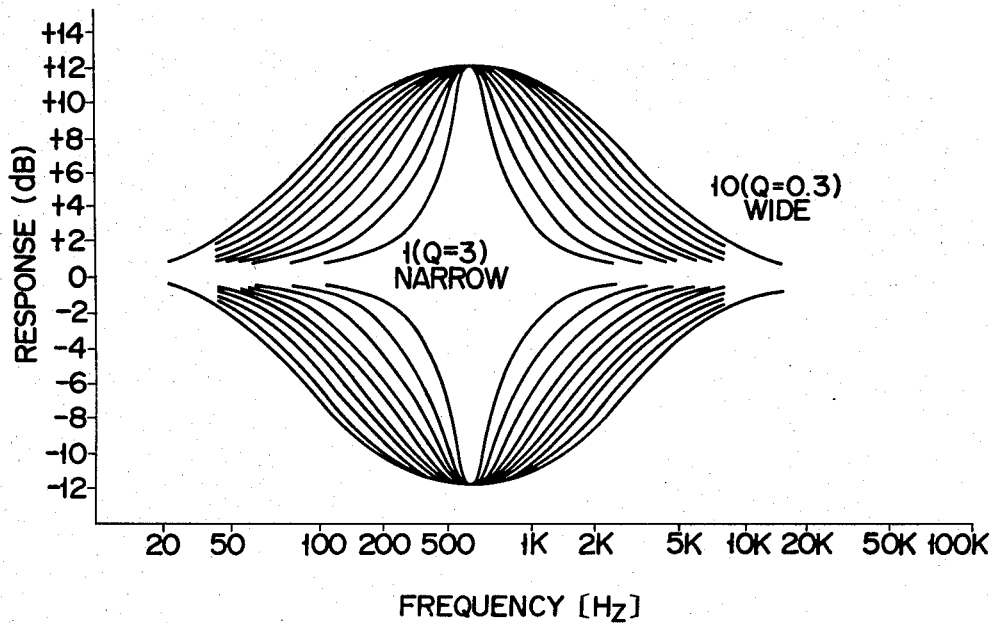
FIGS. 8, 9 and 10 show the frequency response for explaining the frequency characteristic adjusting circuit shown in FIG. 7.
Figure 9:
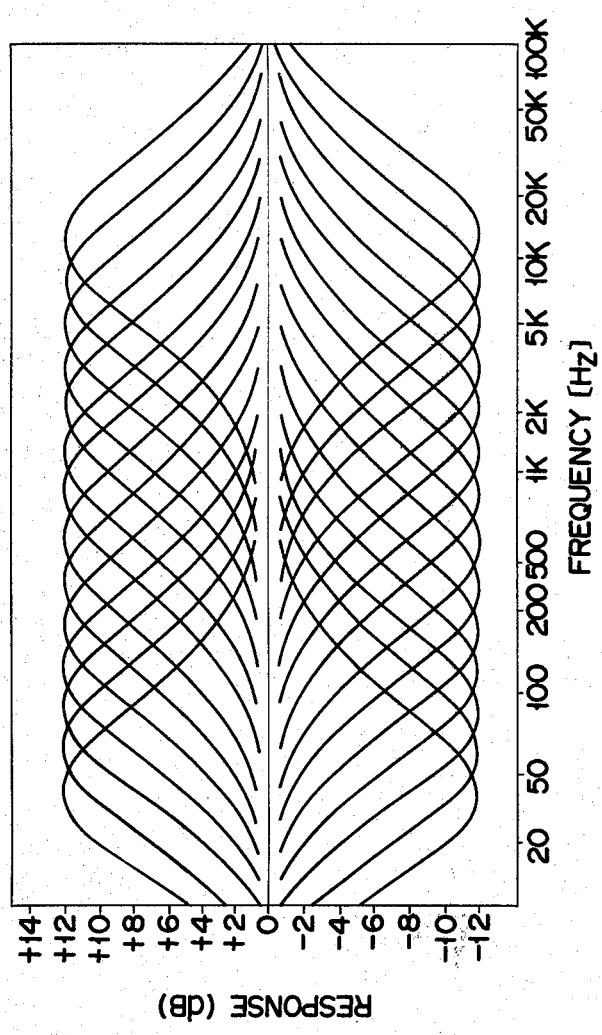

Namely, the quality factor variable characteristic shown in FIG. 8 is provided by changing the variable resistor 53 of filter 50 and the center frequency variable characteristic shown in FIG. 9 is provided by changing both variable resistors 59 and 62. Dip amount is changed, as shown in FIG. 10, by shifting the slider terminal 80c of the variable resistor 80 from the center tap thereof to the fixed terminal 80a, while peak amount is varied by shifting the slider terminal 80c from the center tap to the fixed terminal 80b.

Figure 11:
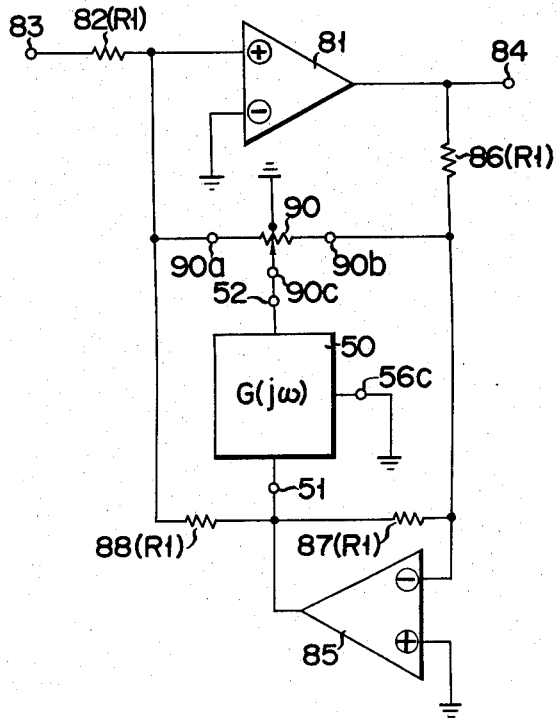
FIG. 11 shows another example of a frequency characteristic adjusting circuit.

FIG. 11 shows another example of a frequency characteristic adjusting circuit in which the filter circuit 50 of this invention is employed and which comprises an operational amplifier 81 having its non-inverting input connected via a resistor 82 (resistance value $R_1$) to an input terminal 83, its output connected to an output terminal 84 and its inverting input grounded; an operational amplifier 85 having its inverting input connected via an input resistor 86 (resistance value $R_1$) to the output terminal 84, its output connected via a feedback resistor 87 (resistance value $R_1$) to the inverting input thereof and via a resistor 88 (resistance value $R_1$) to the non-inverting input of operational amplifier 81 and its non-inverting input grounded; a variable resistor 90 having fixed terminals 90a, 90b connected to the non-inverting input and inverting input of operational amplifiers 81, 85, respectively, and whose center tap is grounded; and the filter circuit 50 having the input terminal 51 connected to the output of operational amplifier 85, the output terminal 52 connected to a slider terminal 90c of variable resistor 90, and the common terminal 56c grounded.

Figure 10:
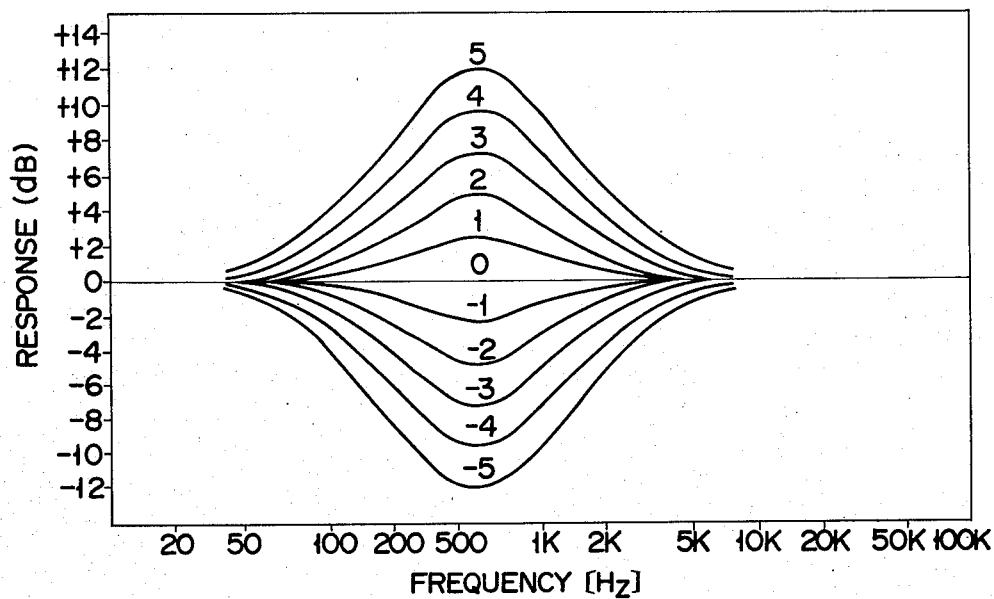

Filter characteristics shown in FIGS. 8 to 10 are also provided by this frequency characteristic adjusting circuit.

Figure 4:
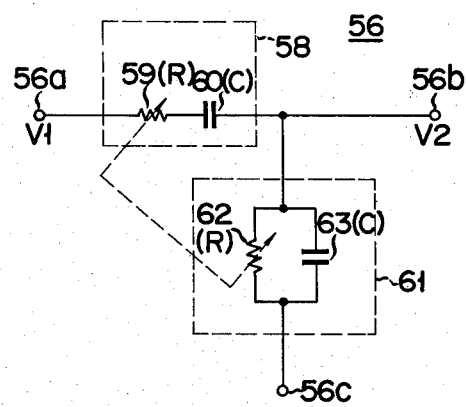
FIG. 4 shows in detail the block 56 of filter circuit shown in FIG. 3.
Figure 5:
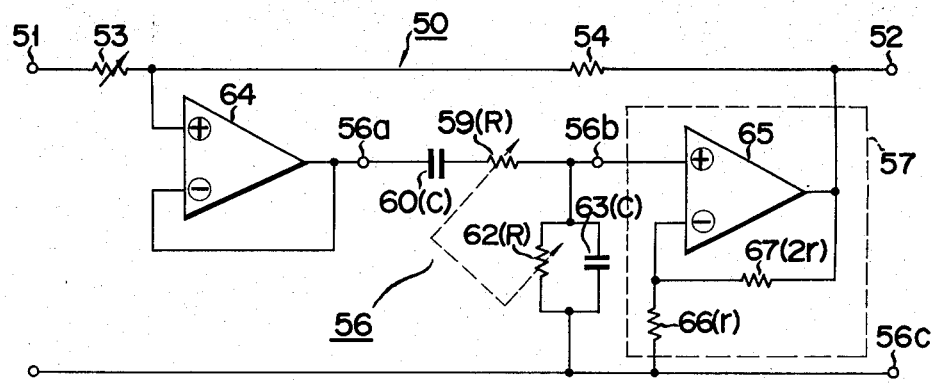
FIG. 5 shows a practical arrangement of the filter circuit shown in FIG. 3.
Figure 6:
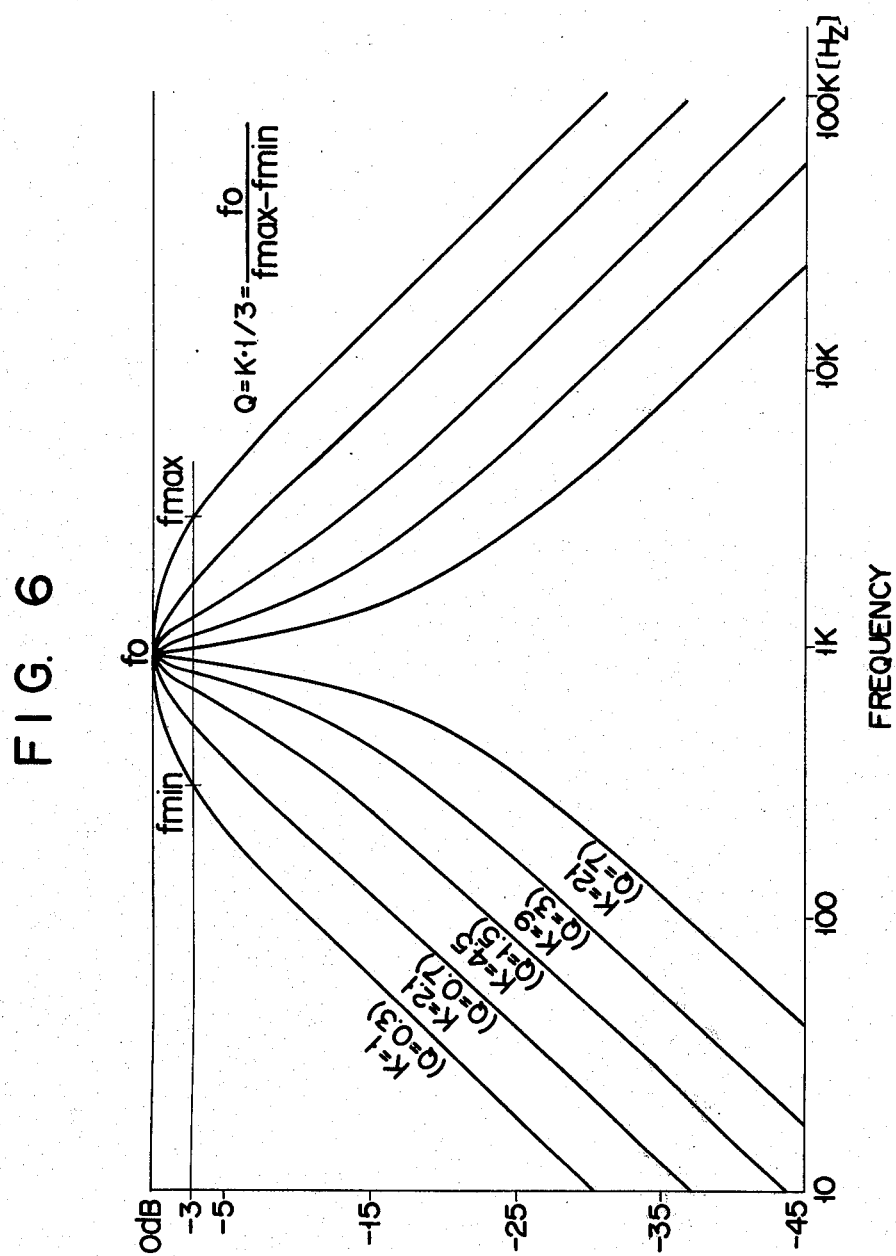
FIG. 6 shows the frequency responses of a filter circuit of the present invention.
Figure 7:
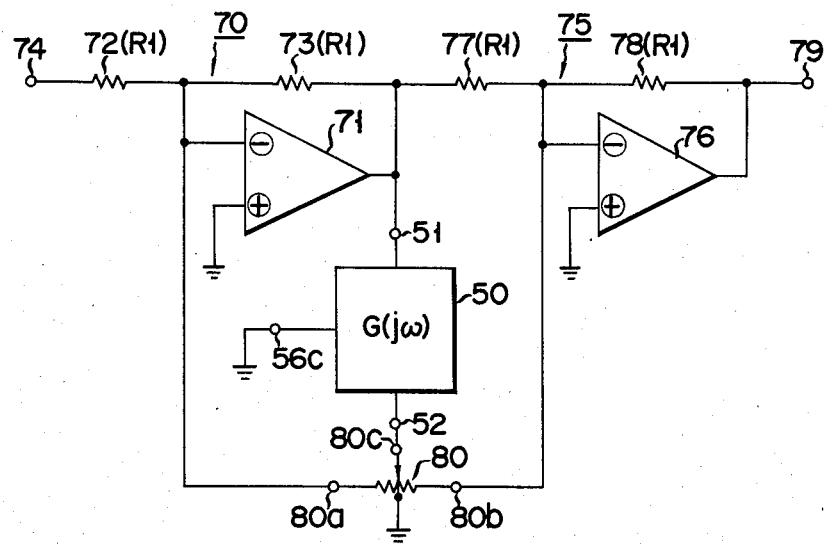
FIG. 7 is a schematic circuit diagram of a frequency characteristic adjusting circuit in which the filter circuit of the present invention may be employed.

The resistor 54 may be of variable type to change quality factor instead of resistor 53 in the bandpass filter shown in FIG. 3. Capacitors 60, 63 may be of variable type to change center frequency instead of resistors 59, 62 in the filter shown in FIG. 4.

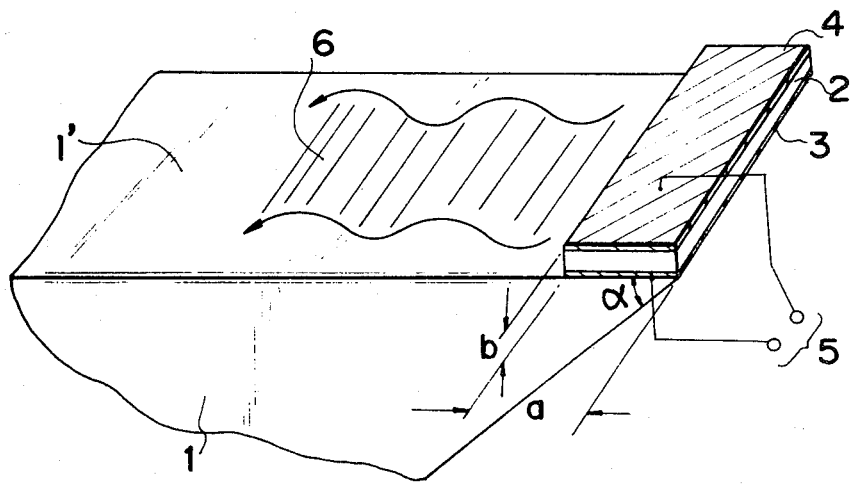

What is claimed is:

1. A filter circuit having input and output terminals and a common terminal, comprising:

a first combination circuit having first and second resistors connected in series between said input and output terminals;

a second combination circuit having a third resistor and a first capacitor connected in series between two terminals, said second combination circuit being connected to the connection point of said first and second resistors at one of said two terminals;

a third combination circuit having a fourth resistor and a second capacitor connected in parallel between the common terminal of said filter circuit and the other terminal of said second combination circuit; and a non-inverting amplifier having input and output and a gain of three, said input of said amplifier being connected to an output of said second and third combination circuits, and said output of said amplifier being connected to said output terminal of said filter circuit; wherein an output signal of said second and third combination circuits is applied to an input side of said amplifier to be non-inverting amplified with a gain of three, an output signal of said amplifier which has a same phase with and a magnitude three-times as great as that of the output signal of said second and third combination circuits is applied to said output terminal of said filter circuit, and a divided output voltage which is obtained by dividing a voltage between an input signal voltage which is applied to said input terminal of said filter circuit and the output signal voltage which is derived at the output terminal of said filter circuit and has the same phase as that of the output signal of said second and third combination circuits is applied to an input side of said second and third combination circuits; and wherein the quality factor of said filter circuit is determined by a ratio of a resistance value of said first resistor to a resistance value of said second resistor, and the gain of said filter circuit is always unity at a resonance frequency of said second and third combination circuits.

2. A filter circuit according to claim 1 wherein one of said first and second resistors is a variable type resistor.

3. A filter circuit according to claim 1 wherein said third and fourth resistors have resistance values substantially equal to each other and said first and second capacitors have capacitance values substantially equal to each other.

4. A filter circuit according to claim 1 or 3 wherein said third and fourth resistors are ganged with each other.

* * * * *

United States Patent [19]

Minagawa

[11] 4,403,202
[45] Sep. 6, 1983

[54] SURFACE ACOUSTIC WAVE DEVICE AND METHOD FOR PRODUCING THE SAME

[75] Inventor: Shoichi Minagawa, Toda, Japan

[73] Assignee: Clarion Co., Ltd., Tokyo, Japan

[21] Appl. No.: 248,112

[22] Filed: Mar. 27, 1981

[30] Foreign Application Priority Data

Mar. 28, 1980 [JP] Japan .................................. 55-39079

[51] Int. Cl.³ ...................... H03H 9/145; H03H 9/42
[52] U.S. Cl. .................................. 333/150; 29/25.35;
310/313 R; 333/154
[58] Field of Search ................................ 333/150–155,
333/193–196; 330/5.5; 310/313 R, 313 A, 313
B, 313 C, 313 D; 29/25.35

[56] References Cited

U.S. PATENT DOCUMENTS 3,289,114 11/1966 Rowen ................................. 333/150
3,654,500 4/1972 Claiborne ........................... 29/25.35
3,840,824 10/1974 Bertoni et al. ...................... 333/150

OTHER PUBLICATIONS

Bowers et al., "Design and Applications of High Efficiency Wideband Saw Edge Bonded Transducers", 1978 Ultrasonics Symposium Proceedings, Cherry Hill, N.J., USA 25–27, Sep. 1978, IEEE CAt. #78 CH 1344–ISU; pp. 744–748.

Primary Examiner—Marvin L. Nussbaum
Attorney, Agent, or Firm—Flynn, Thiel, Boutell & Tanis

[57] ABSTRACT

A surface acoustic wave device wherein a laminated structure comprised of a piezoelectric member and a metal electrode or electrodes is provided on a surface acoustic wave surface of an elastic body and an acoustic impedance discontinuous face is formed on the elastic body, so that a longitudinal wave generated by the laminated structure is reflected by the acoustic impedance discontinuous face to provide a transverse wave.

15 Claims, 16 Drawing Figures